(12) United States Patent
Tsai et al.

(10) Patent No.: US 12,550,428 B2
(45) Date of Patent: Feb. 10, 2026

(54) SEMICONDUCTOR DEVICE

(71) Applicant: Taiwan Semiconductor Manufacturing Company, Ltd., Hsinchu (TW)

(72) Inventors: Ming-Heng Tsai, Hsinchu (TW); Ta-Chun Lin, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 413 days.

(21) Appl. No.: 18/170,259

(22) Filed: Feb. 16, 2023

(65) Prior Publication Data

US 2024/0113121 A1 Apr. 4, 2024

Related U.S. Application Data

(60) Provisional application No. 63/411,813, filed on Sep. 30, 2022.

(51) Int. Cl.
*H10D 84/85* (2025.01)
*H10D 30/43* (2025.01)
*H10D 30/67* (2025.01)
*H10D 62/10* (2025.01)

(52) U.S. Cl.
CPC .......... *H10D 84/859* (2025.01); *H10D 30/43* (2025.01); *H10D 30/6735* (2025.01); *H10D 62/121* (2025.01)

(58) Field of Classification Search
CPC .. H10D 84/859; H10D 30/43; H10D 30/6735; H10D 62/121
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

(Continued)

Primary Examiner — Steven H Loke
(74) Attorney, Agent, or Firm — Birch, Stewart, Kolasch & Birch, LLP

(57) ABSTRACT

Semiconductor devices are provided. A semiconductor device includes a first well region having a first conductivity type, a second well region having a second conductivity type, a cell, and a pickup tap cell. The cell includes a first forksheet structure. The first forksheet structure includes a first transistor formed over the first well region, a second transistor formed over the second well region, and a first wall structure disposed on and extending along an interface between the first and second well regions. The first transistor and the second transistor are disposed on opposite sides of the first wall structure. The pickup tap cell includes a nanosheet structure. The nanosheet structure includes a pickup transistor formed over the second well region. Source/drain features of the first transistor and the pickup transistor have the second conductivity type, and source/drain features of the second transistor have the first conductivity type.

20 Claims, 12 Drawing Sheets

(56) References Cited

U.S. PATENT DOCUMENTS

2021/0376076 A1* 12/2021 Su .................. H10D 30/014
2022/0102520 A1*  3/2022 Shiliang ............ H10D 30/6757
2023/0420530 A1* 12/2023 Xie .................. H10D 84/8311

* cited by examiner

SEMICONDUCTOR DEVICE

CROSS REFERENCE TO RELATED APPLICATIONS

This application claims priority to U.S. Provisional Application No. 63/411,813, filed on Sep. 30, 2022, the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometric size (i.e., the smallest component that can be created using a fabrication process) has decreased.

For example, as IC technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor.

While MBC transistors with sheet-like channel members generally provide superior gate control and drive current, their wider sheet-like channel members may increase device widths. Such increased device widths may make them less attractive in high packing density applications, such as memory applications. Therefore, forksheet structures are used to reduce cell dimensions, so as to improve packing density of MBC transistors in forming isolation structures to isolate different device regions.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1:
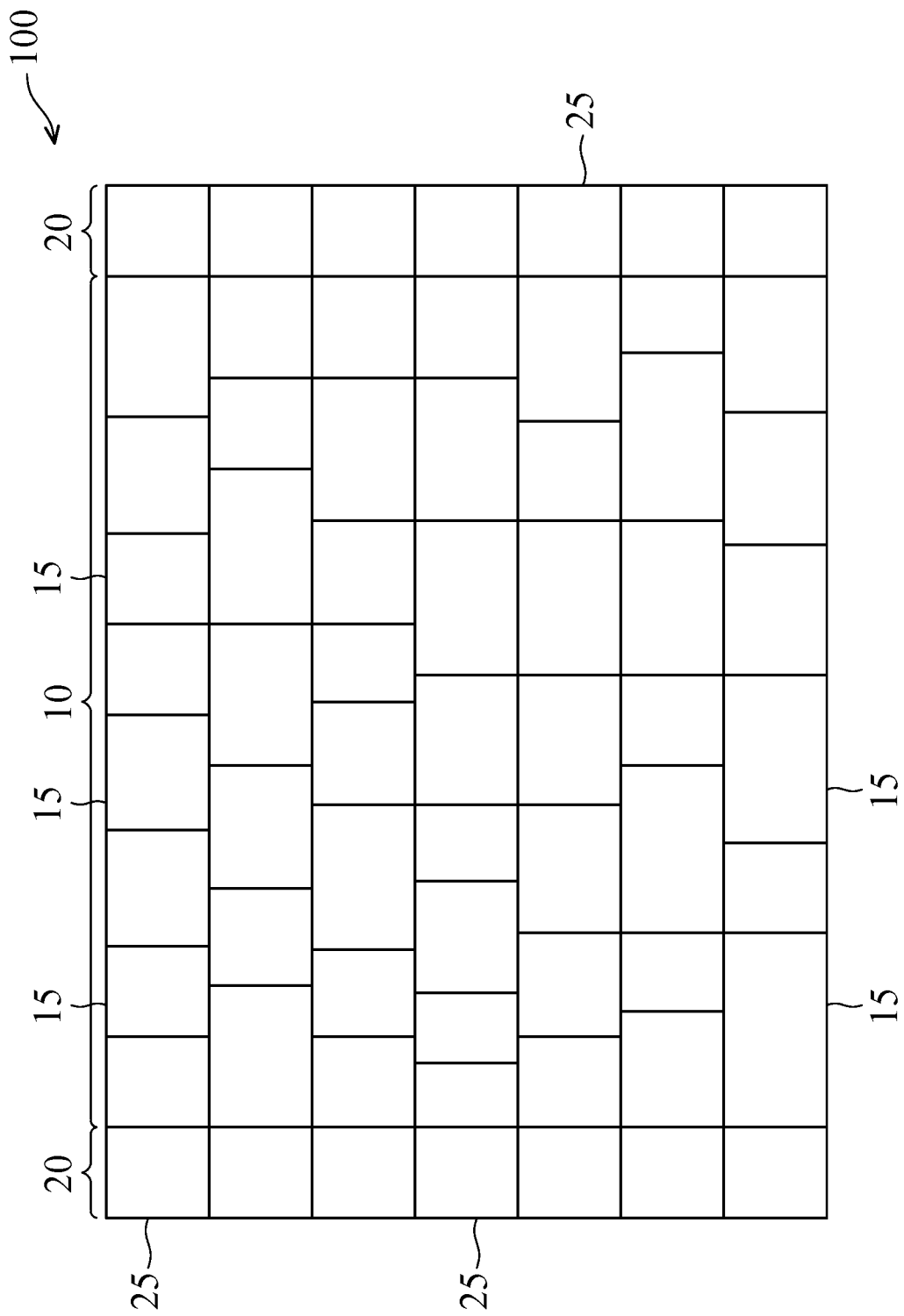
FIG. 1 shows a simplified diagram of a cell array, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and the second nodes are formed in direct contact, and may also include embodiments in which additional nodes may be formed between the first and the second nodes, such that the first and the second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element or feature as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

The present disclosure is generally related to semiconductor devices, and more particularly to circuit cells having field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it should be understood that other embodiments may offer different advantages, not all advantages are necessarily discussed herein, and no particular advantage is required for all embodiments. The details of the present disclosure are described below in conjunction with the accompanying drawings, which illustrate the layout and structure of logic cells, according to some embodiments.

An integrated circuit (IC) includes various circuits and/or memories. In the IC, the circuit may be a logic circuit configured to perform a specific function or operation. The circuit includes multiple logic cells. In some embodiments, the logic cell may be a standard cell (STD cell). The logic cells are arranged in multiple rows and multiple columns of a cell array. In some embodiments, the logic cells are the standard cells (e.g., inverter (INV), AND, OR, NAND, NOR, Flip-Flop, SCAN, etc.), a combination thereof or specific functional cells. The logic cells may have various cell heights and cell widths. Furthermore, the logic cells arranged in the same rows may have the same cell height. Moreover, each logic cell includes multiple transistors, i.e., PMOS and NMOS transistors.

In the IC, each memory includes multiple memory cells arranged in multiple rows and multiple columns of a cell array. In some embodiments, the memory cells have the same circuit configuration and the same semiconductor structure. In some embodiments, the memory cell may be a bit cell of SRAM. Moreover, the memory cells may have the same cell width and the same cell height.

FIG. 1 shows a simplified diagram of a cell array 100, in accordance with some embodiments of the disclosure. The cell array 100 includes multiple cells 15, and the cells 15 are arranged in multiple rows in a circuit region 10. The cell array 100 further includes multiple pickup tap cells 25, and the pickup tap cells 25 are arranged in the pickup regions (or a well strap region) 20. In such embodiments, the pickup regions 20 are disposed at both ends of the rows. In some embodiments, the pickup regions 20 are arranged in the middle of the rows in the circuit region 10. In some embodiments, the pickup tap cells 25 are arranged at a single end of the rows in the pickup region 20. In such embodiments, the cells 15 are logic cells (e.g., the standard cells). In some embodiments, the cells 15 are memory cells (e.g., the SRAM cells).

Figure 2:
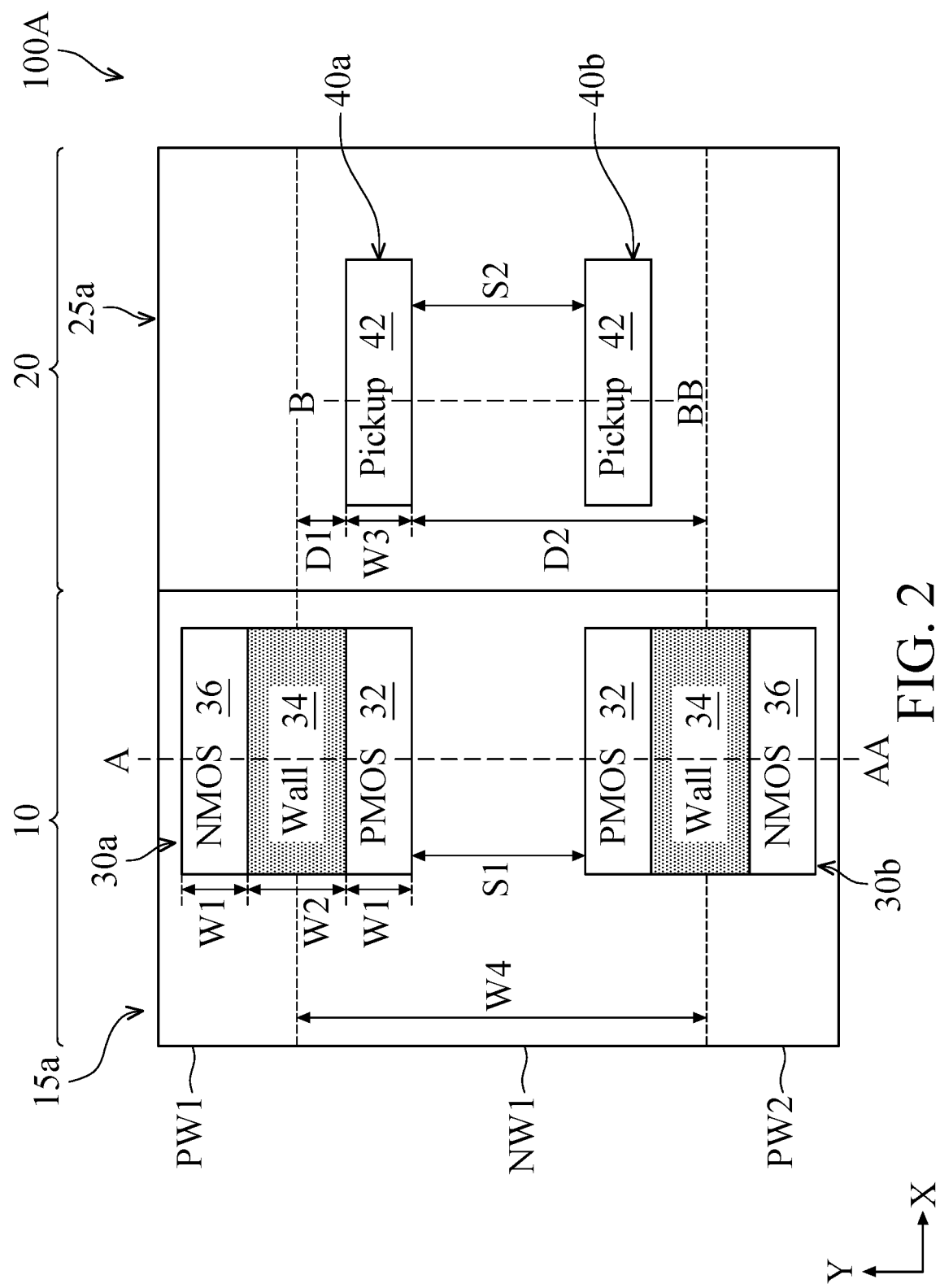
FIG. 2 shows a top view of a semiconductor device including a cell array, in accordance with some embodiments of the disclosure.

FIG. 2 shows a top view of a semiconductor device including a cell array 100A, in accordance with some embodiments of the disclosure. The cell array 100A includes multiple rows, and a portion of a row in the cell array 100A is shown in FIG. 2 to simplify the description. The cell 15a is formed in a circuit region 10, and the pickup tap cell 25a is formed in a pickup region 20. FIG. 2 is used as to demonstrate the configuration between the cell 15a and the pickup tap cell 25a. The number of the cell 15a and the pickup tap cell 25a in the row are used as an example and are not intended to limit the cell array 100A.

In FIG. 2, the cell 15a is in contact with the pickup tap cell 25a. The cell 15a includes the forksheet structures 30a and 30b. Each of the forksheet structures 30a and 30b includes a P-type transistor 32, an N-type transistor 36 and a wall structure 34. Furthermore, the P-type transistor 32 is separated from the N-type transistor 36 by the wall structure 34. The pickup tap cell 25a includes the nanosheet structures 40a and 40b Furthermore, each of the nanosheet structures 40a and 40b includes a pickup device formed by a pickup transistor 42. In such embodiments, a spacing S1 between the forksheet structures 30a and 30b is equal to a spacing S2 between the nanosheet structures 40a and 40b. In some embodiments, the spacing S1 is different from the spacing S2.

Figure 3:
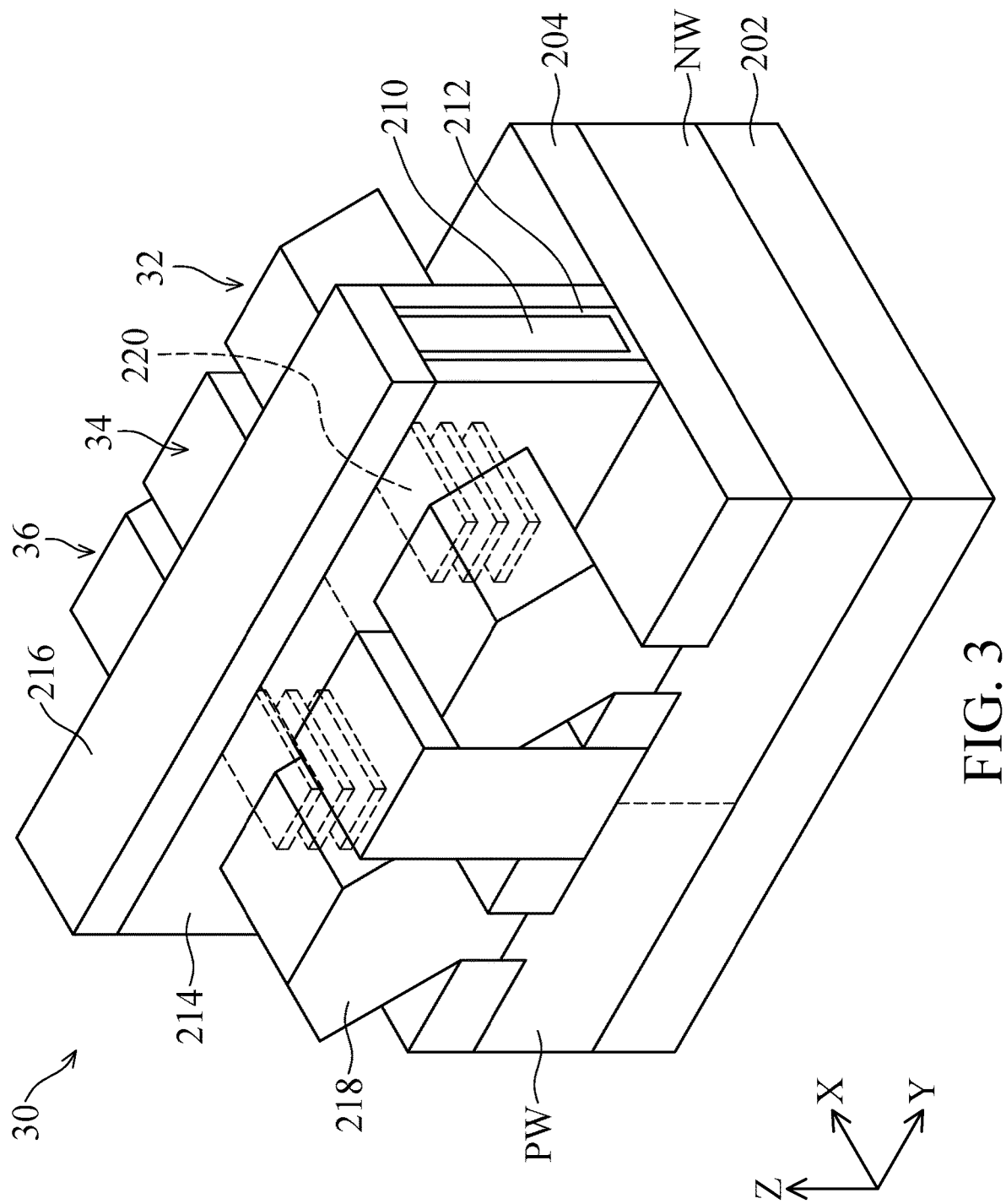
FIG. 3 shows a perspective view of an exemplary forksheet structure, in accordance with some embodiments of the disclosure.

Referring to FIG. 3, a perspective view of an exemplary forksheet structure 30 (e.g., the forksheet structures 30a and 30b) is illustrated. The forksheet structure 30 is formed over the substrate 202. The forksheet structure 30 includes the P-type transistor 32 over an N-type well region NW, the N-type transistor 36 over a P-type well region PW, and the wall structure 34 formed over the interface between the N-type well region NW and the P-type well region PW.

The substrate 202 may contains a semiconductor material, such as bulk silicon (Si). In some embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure. In some embodiments, after the forksheet structure 30 is formed, the substrate 202 may be removed by a suitable process (e.g., a chemical mechanical polishing (CMP) process) for forming back-side interconnections.

Each of the P-type transistor 32 and the N-type transistor 36 includes one or more nanostructures 220 (dash lines) extending in the X-direction and vertically arranged (or stacked) in a Z-direction. More specifically, the nanostructures 220 are spaced from each other in the Z-direction. In some embodiments, the nanostructures 220 may also be referred to as channels, channel layers, nanosheets, or nanowires. The nanostructures 220 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 220 include silicon for the N-type transistor 36. In some embodiments, the nanostructures 220 include silicon germanium for the P-type transistor 32. In some embodiments, the nanostructures 220 are all made of silicon, and the type of the transistors 32 and 36 depend on work function metal layer wrapping around the nanostructures 220.

The forksheet structure 30 includes a gate structure including a gate electrode 210 and a gate dielectric layer 212. The gate dielectric layer 212 wraps around the nanostructures 220 and the gate electrode 210 wraps around the gate dielectric layer 212 (not shown). The gate electrode 210 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 210 may include a capping layer, a barrier layer, an n-type work function metal layer, a p-type work function metal layer, and a fill material (not shown). In some embodiments, the P-type transistor 32 and the N-type transistor 36 are formed by the same work function material. In some embodiments, the P-type transistor 32 and the N-type transistor 36 are made of different work function materials.

The gate dielectric layer 212 may include dielectric materials, such as silicon oxide, silicon nitride, silicon oxynitride, dielectric material(s) with high dielectric constant (high-k or HK), or a combination thereof. Examples of high-k dielectric materials include $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

As shown in FIG. 3, the gate spacers 214 are on sidewalls of the gate dielectric layer 212 and over the nanostructures 220 (not shown). The gate spacers 214 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 214 may include a single layer or a multi-layer structure.

The gate top dielectric layer 216 is formed over the gate dielectric layer 212, the gate electrode 210, and the nanostructures 220. The gate top dielectric layer 216 is used for contact etch protection layer. The material of gate top dielectric layer 216 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

The forksheet structure 30 further includes epitaxially-grown materials 218. The epitaxially-grown materials 218 may also be referred to as source/drain, source/drain features, source/drain regions or source/drain nodes. As shown in FIG. 3, two epitaxially-grown materials 218 on opposite sides of the gate structure of the P-type transistor 32 serve as the source/drain features of the P-type transistor 32, and two epitaxially-grown materials 218 on opposite sides of the gate structure of the N-type transistor 36 serve as the source/drain features of the N-type transistor 36. In some embodiments, for the N-type transistor 36, the epitaxially-grown materials 218 may include N-type materials, such as SiP, SiC, SiPC, SiAs, Si, or a combination thereof. In some embodiments, for the P-type transistor 32, the epitaxially-grown materials 218 may include P-type materials, such as SiGe, SiGeC, Ge, Si, a boron-doped SiGe, boron and carbon doped SiGe, or a combination thereof. In other words, the source/drain features of the P-type transistor 32 and the N-type well region NW have different conductivity types, and the source/drain features of the N-type transistor 36 and the P-type well region PW have different conductivity types. Source/drain region(s) may refer to a source or a drain, individually or collectively dependent upon the context. The nanostructures 220 (dash lines) extends in the X-direction to connect two epitaxially-grown materials 218. Such the nanostructures 220 and the epitaxially-grown materials 218 connected continuously with each other may be collectively referred to as an active area.

Isolation feature 204 is over the P-type well region PW and the N-type well region NW and under the gate dielectric layer 212, the gate electrode 210, and the gate spacers 214. In some embodiments, the isolation feature 204 may include different structures, such as shallow trench isolation (STI) structure, deep trench isolation (DTI) structure. Furthermore, the isolation feature 204 is also referred as to as a STI feature or DTI feature.

The forksheet structure 30 allow for increased density of the transistors. In the forksheet structure 30, the wall structure 34 extends along the interface between the P-type well region PW and the N-type well region NW, i.e., in the X direction. Furthermore, the wall structure 34 has a wall width in the Y-direction. The P-type transistor 32 is separated from the N-type transistor 36 by the wall structure 34. The P-type transistor 32 and the N-type transistor 36 are adjacent to the opposite sides of the wall structure 34. Furthermore, the P-type transistor 32 and the N-type transistor 36 are in contact with the wall structure 34. Compared with the traditional GAA transistors, the distance between the P-type transistor 32 and the N-type transistor 36 is decreased, thereby increasing the density of the forksheet structures 30 in the IC.

In FIG. 3, the forksheet structure 30 is formed between the N-type well region NE and P-type well region PW, and includes the different types of transistors, such as the P-type transistor 32 and the N-type transistor 36. In some embodiment, the forksheet structure 30 is formed over the N-type well region NW, and only includes the P-type transistors 32. Therefore, the well structure 34 is sandwiched by two P-type transistors 32. In some embodiment, the forksheet structure 30 is formed over the P-type well region PW, and only includes the N-type transistors 36. Therefore, the well structure 34 is sandwiched by two N-type transistors 36.

Figure 4:
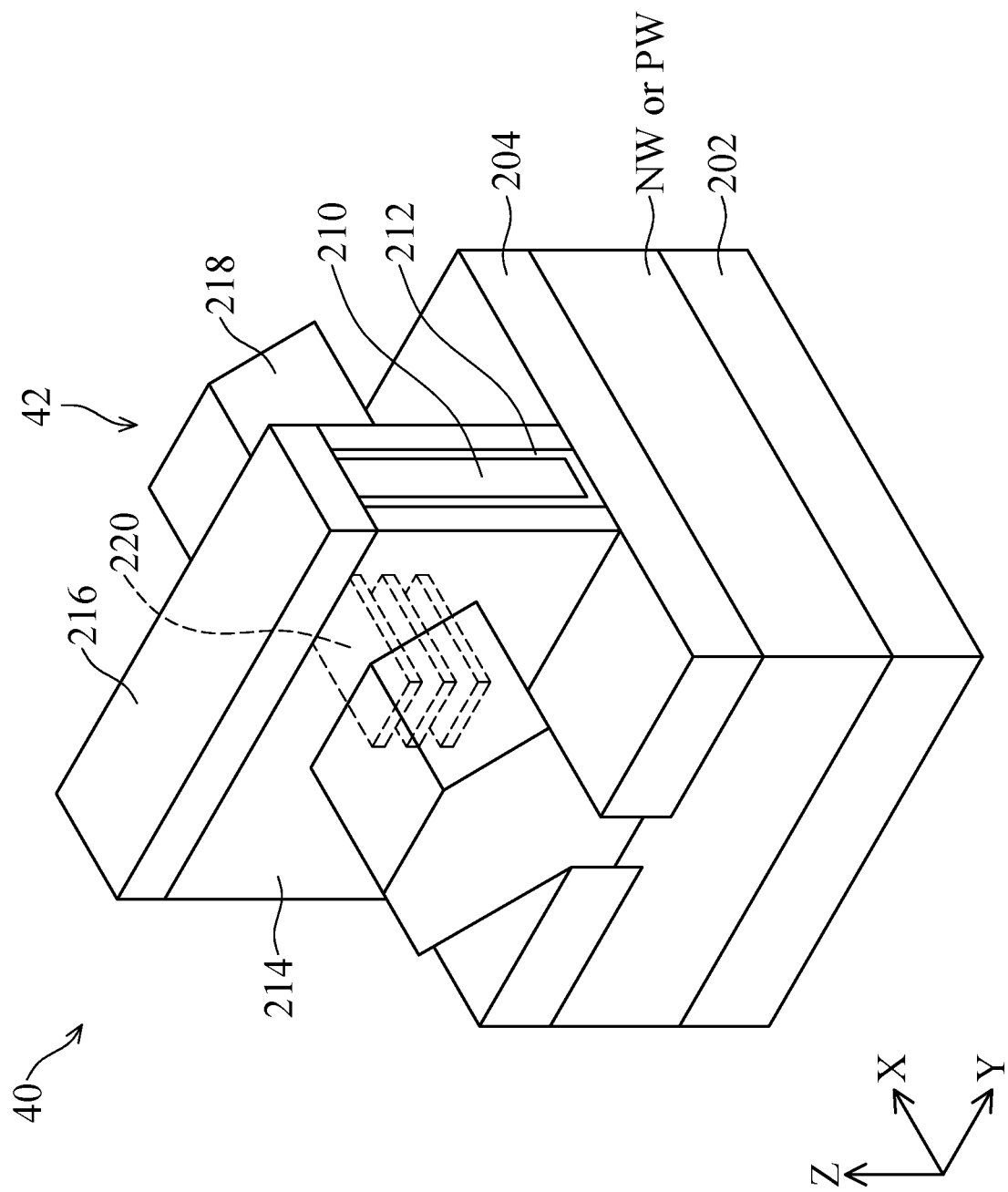
FIG. 4 shows a perspective view of an exemplary nanosheet structure, in accordance with some embodiments of the disclosure.

Referring to FIG. 4, a perspective view of an exemplary nanosheet structure 40 (e.g., the nanosheet structures 40a and 40b) is illustrated. The nanosheet structure 40 is formed over the substrate 202, and includes a pickup device, and the pickup device is a pickup transistor 42 over an N-type well region NW or a P-type well region PW. Features in the nanosheet structure 40 of FIG. 4 that are the same or similar to those in the forksheet structure 30 of FIG. 3 are given the same reference numbers, and a detailed description thereof is thus omitted. Compared with the forksheet structure 30 of FIG. 3, no wall structure 34 is formed in the nanosheet structure 40 of FIG. 4. Furthermore, the source/drain features of the pickup transistor 42 and the well region have the same conductivity type. For example, if the well region is the N-type well region, the source/drain features of the pickup transistor 42 and the N-type well region NW have the same conductivity type (e.g., N-type dopant). If the well region is the P-type well region, the source/drain features of the pickup transistor 42 and the P-type well region PW have the same conductivity type (e.g., P-type dopant).

Since no wall structure is formed in the nanosheet structure 40, area of the source/drain feature 218 will not be confined by the wall structure, thereby avoiding poor connect feature (contact or metal-to-oxide diffusion (MD) contact) landing efficiency at lateral side of the source/drain feature 218 and decreasing resistance between the source/drain feature 218 and the connect feature thereof. In some embodiments, the size (area) of the connect feature in the nanosheet structure 40 is about 1.1 to 1.4 times the size (area) of connect feature in the forksheet structure 30 (i.e., an increase of 10% through 40%).

Since the connect feature corresponding to the source/drain feature 218 has larger area, the via between the connect feature and an upper metallization layer also has larger area. In some embodiments, the via size (area) of the nanosheet structure 40 is about 1.1 to 2.5 times the via size (area) of the forksheet structure 30 (i.e., an increase of 10% through 150%). In some embodiments, the via size (area) of the nanosheet structure 40 is about 1.5 to 5 times the via size (area) of the forksheet structure 30 (i.e., an increase of 50% through 400%), and a width of the connect feature of the nanosheet structure 40 is about 1.3 to 5 times a width of the connect feature of the forksheet structure 30 (i.e., an increase of 30% through 400%).

Compared with the forksheet structure 30 that may induce strained source/drain (SSD) etching front shallower abut wall due to shadowing effect, the nanosheet structure 40 has two free sides for SSD etching for better depth uniformity and lower resistance. In other words, the nanosheet structure 40 has deeper SSD depth than the forksheet structure 30. In some embodiments, the SSD depth of the nanosheet structure 40 is about 1.05 to 1.4 times the SSD depth of the forksheet structure 30 (i.e., an increase of 5% through 40%).

The nanosheet structure 40 can have lower resistance because of wider sheet width, wider EPI area and larger MD landing area, less MD landing impact by wall corner effect, zero shadowing effect by at pre-SSD dummy side wall deposition, and deeper SSD depth due to larger OD width and/or Wall-less around the nanosheet structure 40.

Referring back to FIG. 2, in the cell 15a, the P-type transistors 32 of the forksheet structures 30a and 30b are formed over the N-type well region NW1. The N-type transistor 36 of the forksheet structure 30a is formed over the P-type well region PW1, and the N-type transistor 36 of the forksheet structure 30b is formed over the P-type well region PW2. The P-type well region PW1 is separated from the P-type well region PW2. The N-type well region NW1 has a well width W4 in the Y-direction. In some embodiments, the well width W4 is a critical dimension (CD) for the N-type well region NW1.

The wall structure 34 of the forksheet structure 30a extends in the X-direction and along the interface between the P-type well region PW1 and the N-type well region NW1. The wall structure 34 of the forksheet structure 30b extends in the X-direction and along the interface between the P-type well region PW2 and the N-type well region NW1. The wall structures 34 of the forksheet structures 30a and 30b have a wall width W2 in the Y-direction.

The nanostructures (e.g., 220 of FIG. 3) of the forksheet structures 30a and 30b have a sheet width W1 in the Y-direction. In such embodiments, the wall width W2 is greater than the sheet width W1. In other embodiments, the wall width W2 is less than or equal to the sheet width W1.

In the pickup tap cell 25a, the nanosheet structure 40a is disposed close to the P-type well region PW1. In other words, the distance D1 between the nanosheet structure 40a and the P-type well region PW1 is shorter than the distance D2 between the nanosheet structure 40a and the P-type well region PW2 (i.e., D2>D1). In some embodiments, the distance D1 is less than half of the wall width W2 (i.e., D1<W2/2). Similarly, the nanosheet structure 40b is disposed close to the P-type well region PW2.

The nanostructures (e.g., 220 of FIG. 4) of the nanosheet structures 40a and 40b have a sheet width W3 in the Y-direction. In such embodiments, the sheet width W3 of the nanosheet structures 40a and 40b is equal to the sheet width W1 of the forksheet structures 30a and 30b (i.e., W3=W1). In some embodiments, the nanosheet structures 40a and 40b may have wider sheet width W3 than the sheet width W1 of the forksheet structures 30a and 30b due to continuous sheet without the wall structure 34. Therefore, the sheet width W3 is greater than the sheet width W1 (i.e., W3>W1) and preferred within a ratio from about 1.05 to about 10.

In some embodiments, each of the nanosheet structures 40a and 40b includes more than one pickup transistor 42, and the sheet width W3 of the pickup transistors 42 is equal to the sheet width W1 of the forksheet structure 30 (i.e., W3=W1).

In some embodiments, each of the nanosheet structures 40a and 40b includes more than one pickup transistor 42, and the sheet width W3 is greater than the sheet width W1 (i.e., W3>W1) and preferred within a ratio from about 1.05 to about 3.

In some embodiments, the pickup transistor 42 of the nanosheet structure 40a is aligned with the P-type transistor 32 of the forksheet structure 30a in the X direction, and the pickup transistor 42 of the nanosheet structure 40b is aligned with the P-type transistor 32 of the forksheet structure 30b in the X direction.

In the pickup tap cell 25a, the nanosheet structures 40a and 40b are formed over the N-type well region NW1. The nanosheet structures 40a and 40b over the N-type well region NW1 may serve as the N-type pick up structure, so as to electrically connect the N-type well region NW1 to a VDD line (e.g., a power supply voltage) through an interconnect structure or a power mesh (not shown). Similarly, the nanosheet structures 40 over the P-type well regions PW1 and PW2 may serve as the P-type pick up structure. Furthermore, the P-type well regions PW1 and PW2 are electrically connected to a VSS line (e.g., a ground) through the P-type pick up structure (not shown) in the adjacent row of the cell array or in the edge of the cell array. In some embodiments, the sheet width W3 of the P-type pick up structure is different from the sheet width W3 of the N-type pick up structure. In some embodiments, the ratio of the sheet width W3 of the N-type pick up structure and the sheet width W3 of the P-type pick up structure is in the ratio range of 0.4 through 2.5.

In the cell array 100A, the contacted poly pitch (CPP) of the nanosheet structures 40a and 40b is greater than the CPP of the forksheet structures 30a and 30b. In some embodiments, the CPP of the nanosheet structure 40 is about 1.05 to 1.2 times the CPP of the forksheet structure 30 (i.e., an increase of 5% through 20%).

Figure 5:
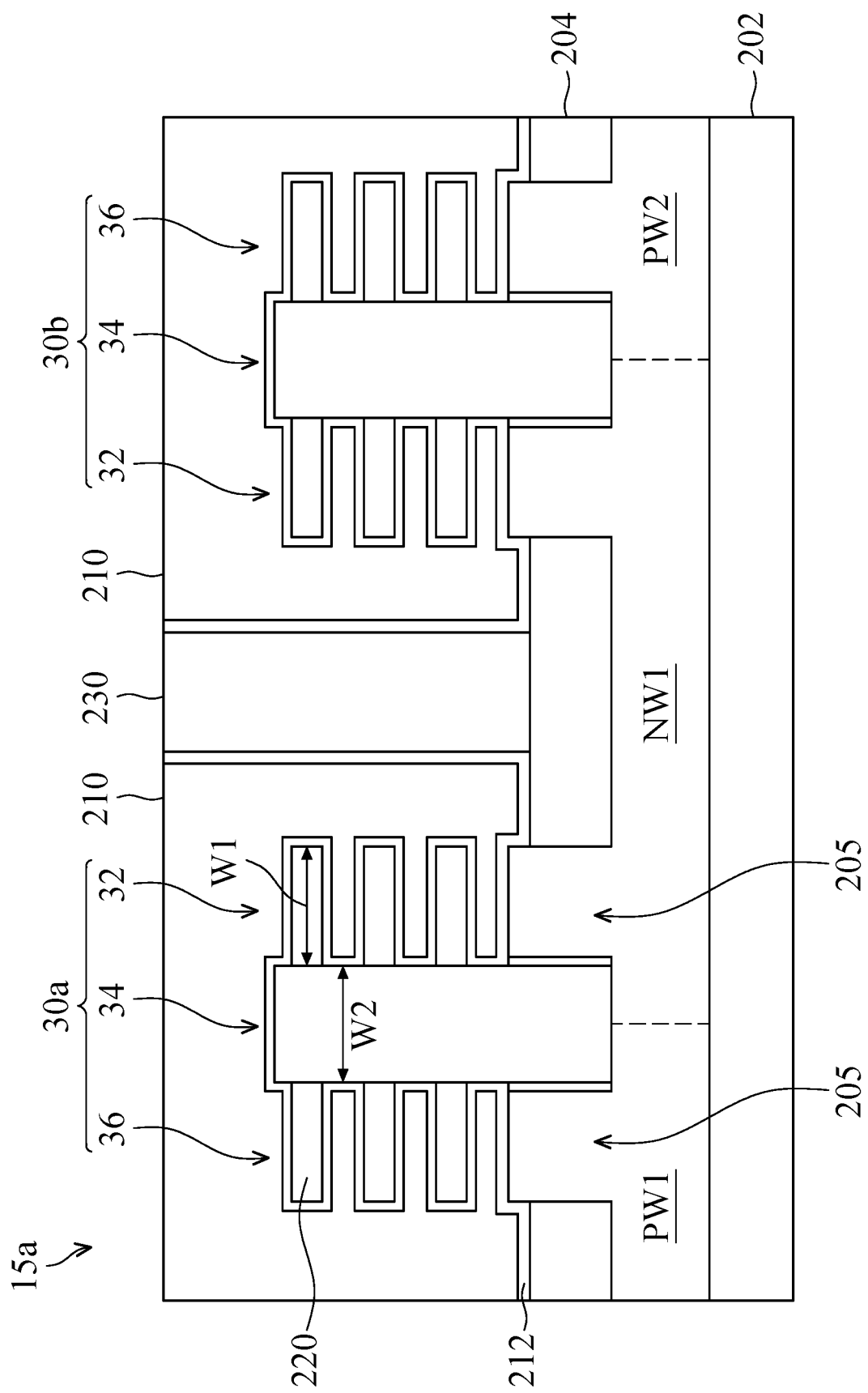
FIG. 5 shows a cross sectional view of the semiconductor device of the cell array along a line A-AA in FIG. 2, in accordance with some embodiments of the disclosure.

FIG. 5 shows a cross sectional view of the semiconductor device of the cell array 100A along a line A-AA in FIG. 2, in accordance with some embodiments of the disclosure. In FIG. 5, the cross sectional view of the forksheet structures 30a and 30b are illustrated. Features in FIG. 5 that are the same or similar to those in the forksheet structure 30 of FIG. 3 are given the same reference numbers, and a detailed description thereof is thus omitted.

The N-type well region NW1 and the P-type well regions PW1 and PW2 are formed over the substrate 202. The fin base structures 205 are formed in the N-type well region NW1 and the P-type well regions PW1 and PW2. The fin base structures 205 are separated from each other by the isolation feature 204 (e.g., the STI). The nanostructures 220 are vertically stacked sheets over the fin base structures 205 to form the P-type transistors 32 over the N-type well region NW1 and the N-type transistors 36 over the P-type well region PW1 and PW2.

In some embodiments, the wall structure 34 is formed by multiple layers of insulating materials. The insulating materials are selected from a group consisting of $SiO_2$, SiN, SiCN, SiCON, SiCO, AlO, HfO, HK material (K>=7), or a combination thereof. Furthermore, the wall structure 34 may be deposited using CVD, PVD, ALD, HDPCVD, MOCVD, RPCVD, PECVD, LPCVD, ALCVD, APCVD, other applicable methods, or combinations thereof.

The forksheet structures 30a and 30b are separated from each other by a dielectric feature 230. The dielectric feature 230 may include one or more dielectric layers including dielectric materials, such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), a low-k dielectric material, other suitable dielectric material, or a combination thereof. In some embodiments, the dielectric feature 230 is an inter-layer dielectric (ILD) layer.

Figure 6:
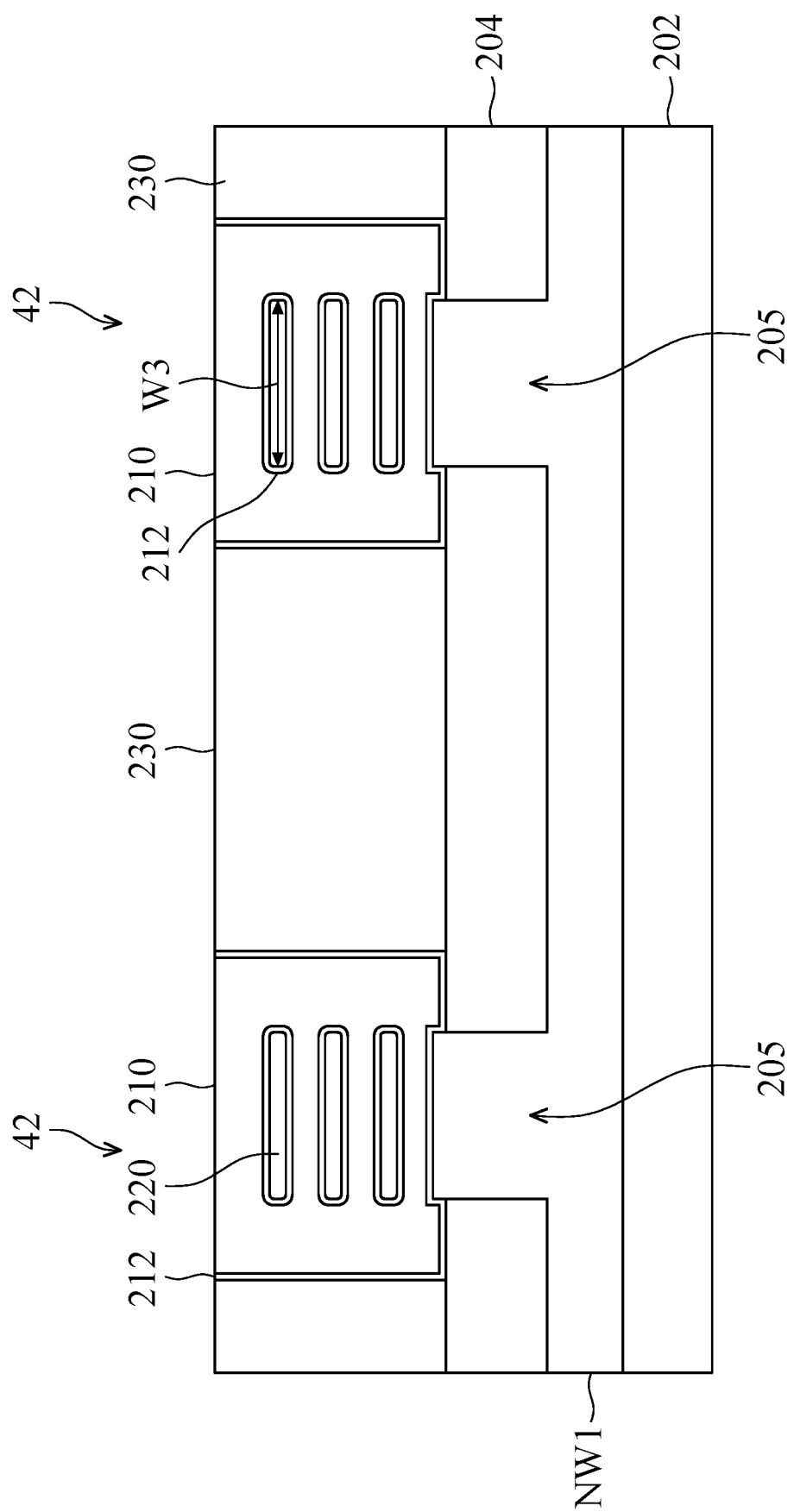
FIG. 6 shows a cross sectional view of the semiconductor device of the cell array along a line B-BB in FIG. 2, in accordance with some embodiments of the disclosure.

FIG. 6 shows a cross sectional view of the semiconductor device of the cell array 100A along a line B-BB in FIG. 2, in accordance with some embodiments of the disclosure. In FIG. 6, the cross sectional view the pickup transistors 42 in the nanosheet structures 40a and 40b are illustrated. Features in FIG. 6 that are the same or similar to those in the nanosheet structure 40 of FIG. 4 are given the same reference numbers, and a detailed description thereof is thus omitted.

The N-type well region NW1 is formed over the substrate 202. The fin base structures 205 are formed in the N-type well region NW. The fin base structures 205 are separated from each other by the isolation feature 204 (e.g., the STI). The nanostructures 220 are vertically stacked sheets over the fin base structures 205 to form the pickup transistors 42. The pickup transistors 42 are separated from each other by the dielectric feature 230.

Figure 7:
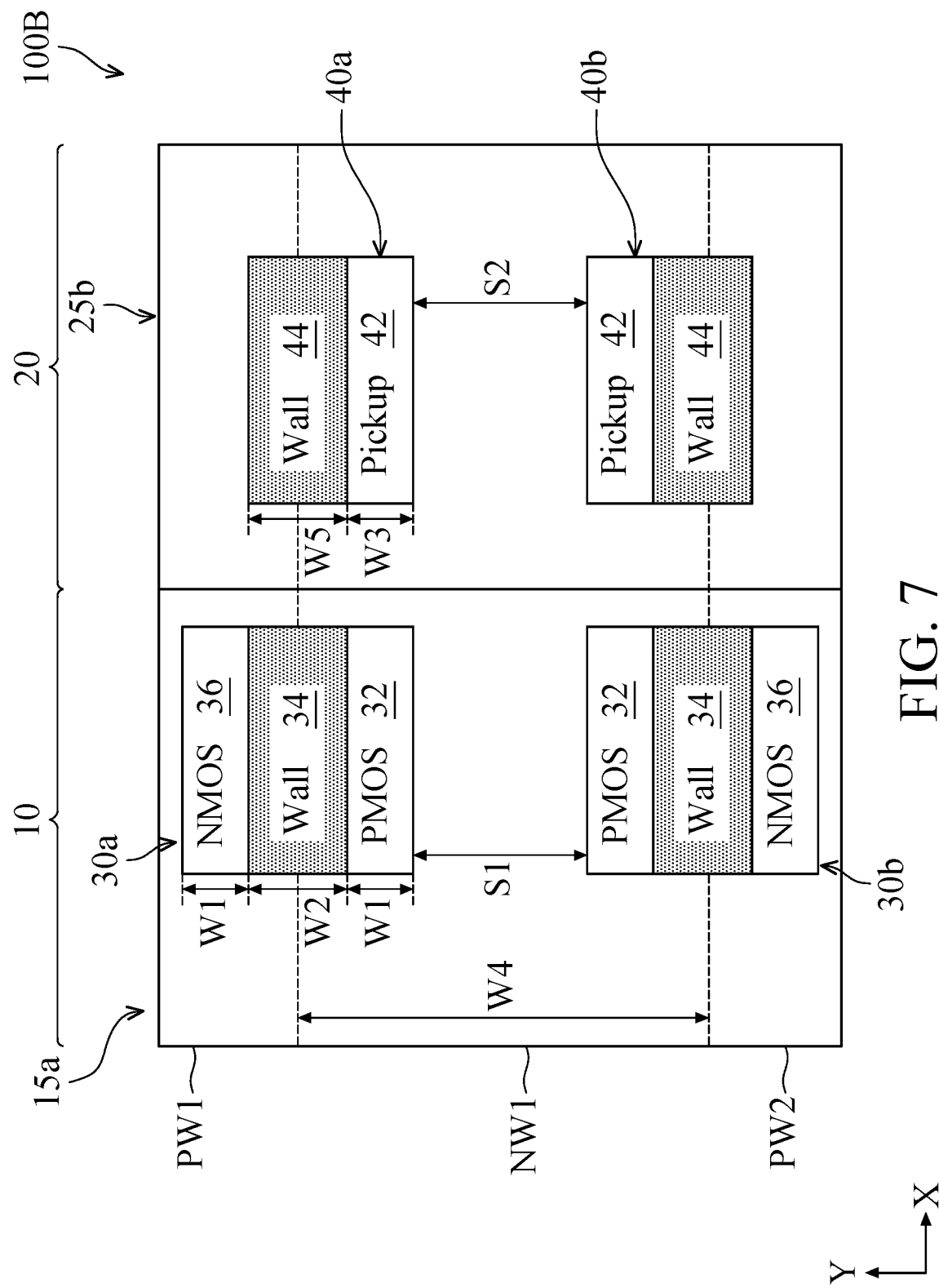
FIG. 7 shows a top view of a semiconductor device including a cell array, in accordance with some embodiments of the disclosure.

FIG. 7 shows a top view of a semiconductor device including a cell array 100B, in accordance with some embodiments of the disclosure. The cell array 100B includes multiple rows, and a portion of a row in the cell array 100B is shown in FIG. 7 to simplify the description. The cell 15a is formed in the circuit region 10, and the pickup tap cell 25b is formed in the pickup region 20. The configuration of the pickup tap cell 25b is similar to the configuration of the pickup tap cell 25a in FIG. 2, and the difference between the pickup tap cell 25b of FIG. 7 and the pickup tap cell 25a of FIG. 2 is that the pickup tap cell 25b further includes wall structures 44 having a wall width W5. In such embodiment, the wall width W5 is equal to the wall width W2 of the wall structure 34 (i.e., W5=W2). In some embodiments, the wall width W5 is greater than or less than the wall width W2 (i.e., W5≠W2).

In the pickup tap cell 25b, one of the wall structures 44 extends in the X-direction and along the interface between the P-type well region PW1 and the N-type well region NW1, and another wall structure 44 extends in the X-direction and along the interface between the P-type well region PW2 and the N-type well region NW1. In such embodiments, the pickup transistors 42 of the nanosheet structures 40a and 40b are in contact with the wall structure 44. In some embodiments, the pickup transistors 42 of nanosheet structures 40a and 40b are not in contact with the wall structures 44. For example, the pickup transistor 42 is separated from the wall structure 44 by the dielectric feature 230.

Figure 8:
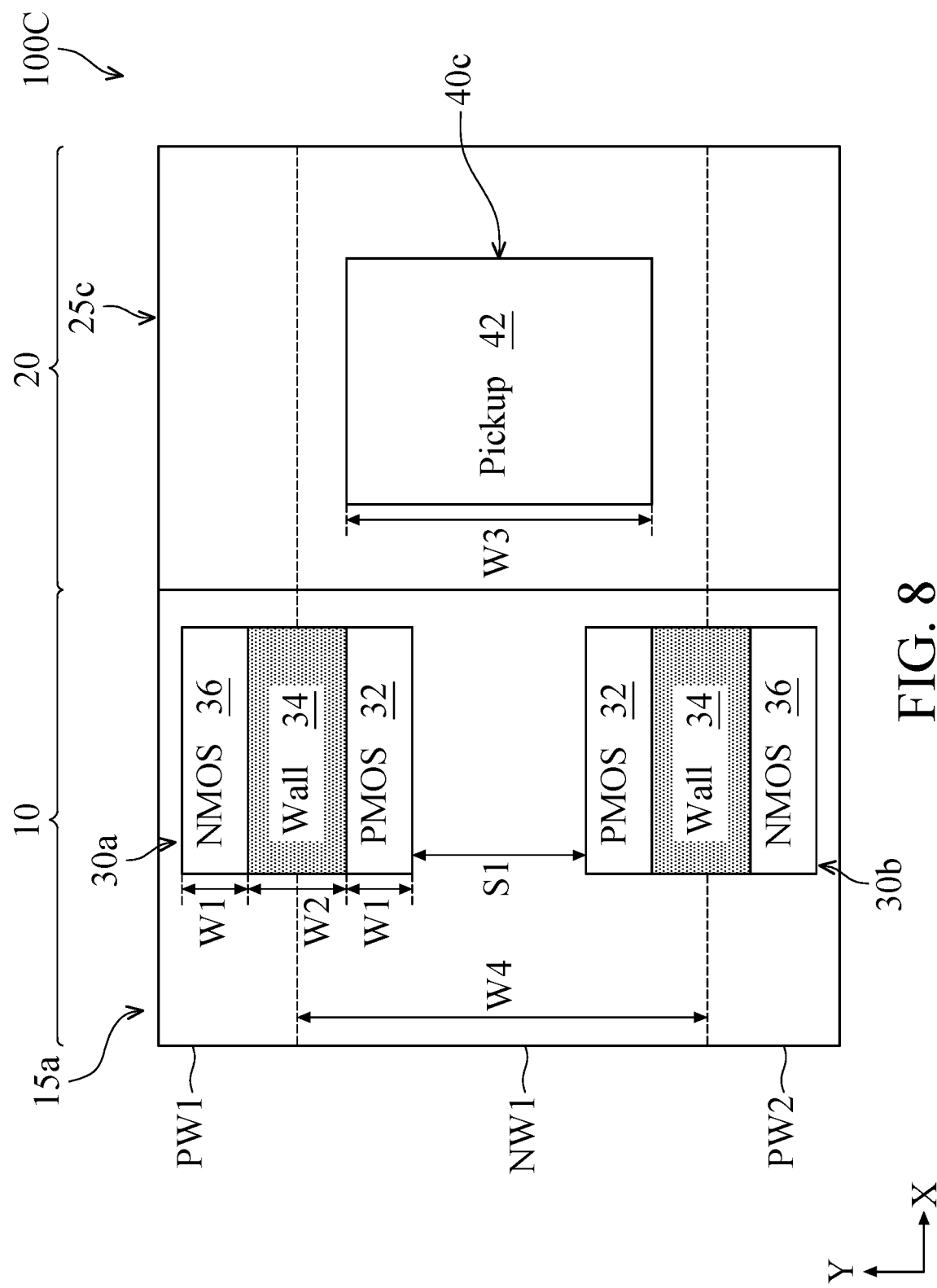
FIG. 8 shows a top view of a semiconductor device including a cell array, in accordance with some embodiments of the disclosure.

FIG. 8 shows a top view of a semiconductor device including a cell array 100C, in accordance with some embodiments of the disclosure. The cell array 100C includes multiple rows, and a portion of a row in the cell array 100C is shown in FIG. 8 to simplify the description. The cell 15a is formed in the circuit region 10, and the pickup tap cell 25c is formed in the pickup region 20. The configuration of the pickup tap cell 25c is similar to the configuration of the pickup tap cell 25a in FIG. 2, and the difference between the pickup tap cell 25c of FIG. 8 and the pickup tap cell 25a of FIG. 2 is that the pickup tap cell 25c only includes a single nanosheet structure 40c. Furthermore, the pickup transistor 42 of the nanosheet structure 40c in FIG. 8 has a larger sheet width W3 than the pickup transistors 42 of the nanosheet structures 40a and 40b in FIG. 2. In other words, the nanosheet structure 40c is a wide nanosheet structure.

In some embodiments, the nanosheet structure 40c includes more than one pickup transistor 42. If the nanosheet structure 40c includes two pickup transistors 42, the sheet width of each pickup transistor 42 is half the sheet width W3. If the nanosheet structure 40c includes three pickup transistors 42, the sheet width of each pickup transistor 42 is one-third the sheet width W3. When the nanosheet structure 40c includes multiple pickup transistors 42, the CPP of the pickup transistors 42 in the nanosheet structure 40c is equal to the CPP of the forksheet structures 30a and 30b.

In the cell array 100C, the sheet width W3 of the pickup transistor 42 is greater than the sheet width W1 of the P-type transistor 32, and is less than the well width W4 of the N-type well region NW1. Therefore, the nanosheet structure 40c is disposed between the forksheet structures 30a and 30b. In some embodiments, the distance between the nanosheet structure 40c and the P-type well region PW1 is equal to the distance between the nanosheet structure 40c and the P-type well region PW2. In some embodiments, the distance between the nanosheet structure 40c and the P-type well region PW1 is different from the distance between the nanosheet structure 40c and the P-type well region PW2. In FIG. 8, the sheet width W3 of the pickup transistor 42 is greater than the spacing S1 between the forksheet structures 30a and 30b. In some embodiments, the sheet width W3 of the pickup transistor 42 is less than or equal to the spacing S1 between the forksheet structures 30a and 30b.

In the pickup tap cell 25c, the nanosheet structure 40c is formed over the N-type well region NW1. The nanosheet structure 40c over the N-type well region NW1 may serve as the N-type pick up structure, so as to electrically connect the N-type well region NW1 to a VDD line through an interconnect structure or a power mesh (not shown). Similarly, the nanosheet structure 40c over the P-type well regions PW1 and PW2 may serve as the P-type pick up structure. Furthermore, the P-type well regions PW1 and PW2 are electrically connected to a VSS line through the P-type pick up structure (not shown) in the adjacent row of the cell array or in the edge of the cell array. In some embodiments, the sheet width W3 of the P-type pick up structure is different from the sheet width W3 of the N-type pick up structure. In some embodiments, the ratio of the sheet width W3 of the N-type pick up structure and the sheet width W3 of the P-type pick up structure is in the ratio range of 0.4 through 2.5.

Figure 9:
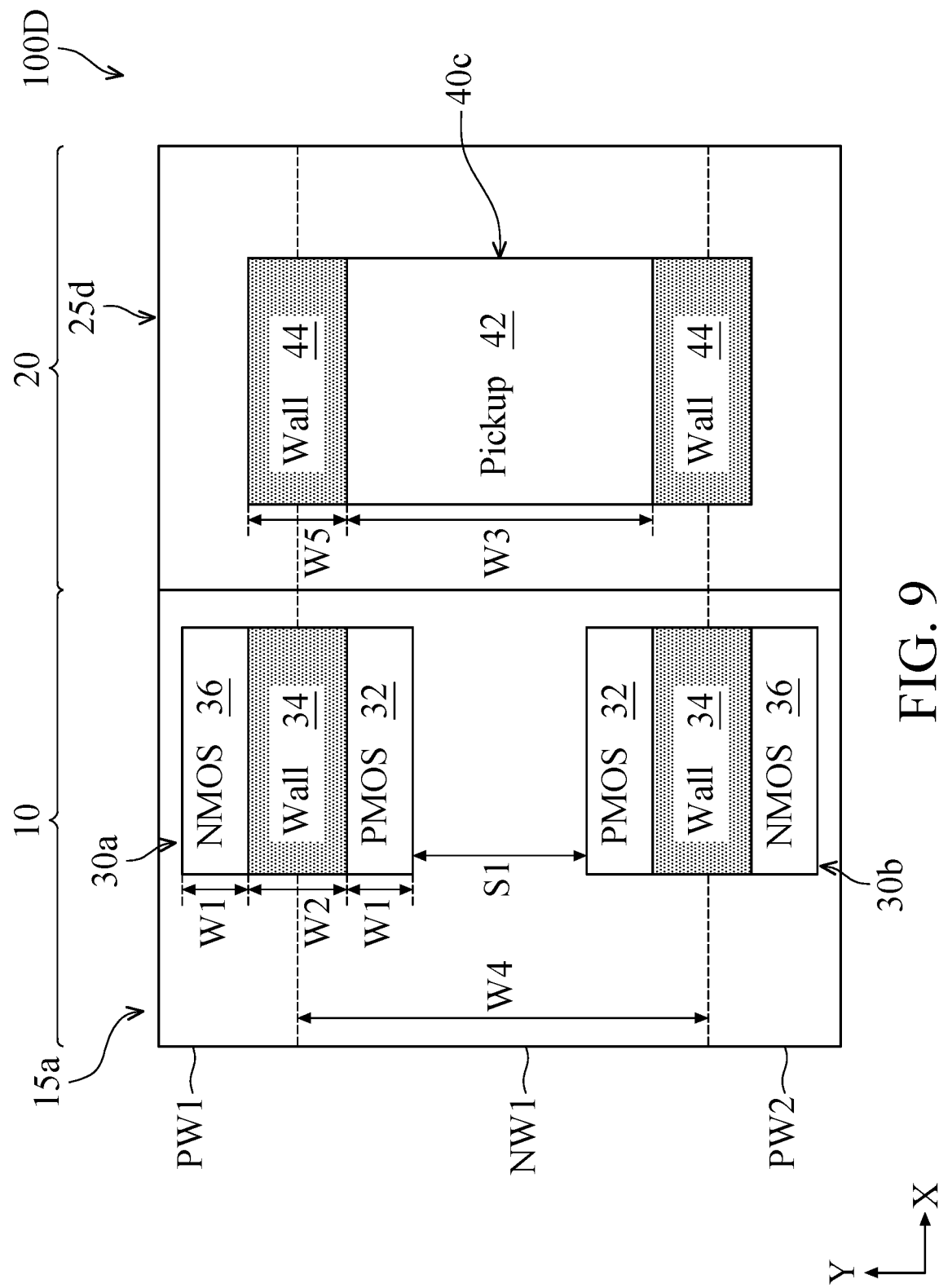
FIG. 9 shows a top view of a semiconductor device including a cell array, in accordance with some embodiments of the disclosure.

FIG. 9 shows a top view of a semiconductor device including a cell array 100D, in accordance with some embodiments of the disclosure. The cell array 100D includes multiple rows, and a portion of a row in the cell array 100D is shown in FIG. 9 to simplify the description. The cell 15a is formed in the circuit region 10, and the pickup tap cell 25d is formed in the pickup region 20. The configuration of the pickup tap cell 25d is similar to the configuration of the pickup tap cell 25c in FIG. 8, and the difference between the pickup tap cell 25d of FIG. 9 and the pickup tap cell 25c of FIG. 8 is that the pickup tap cell 25d further includes wall structures 44 having a wall width W5. In such embodiments, the wall width W5 is equal to the wall width W2 of the wall structure 34 (i.e., W5=W2). In some embodiments, the wall width W5 is greater than or less than the wall width W2 (i.e., W5≠W2).

In the pickup tap cell 25d, one of the wall structures 44 extends in the X-direction and along the interface between the P-type well region PW1 and the N-type well region NW1, and another wall structure 44 extends in the X-direction and along the interface between the P-type well region PW2 and the N-type well region NW1. In such embodiments, the pickup transistor 42 of the nanosheet structure 40c is in contact with both wall structures 44, i.e., the two wall structures 44 are disposed on opposite sides of the pickup transistor 42.

Figure 10:
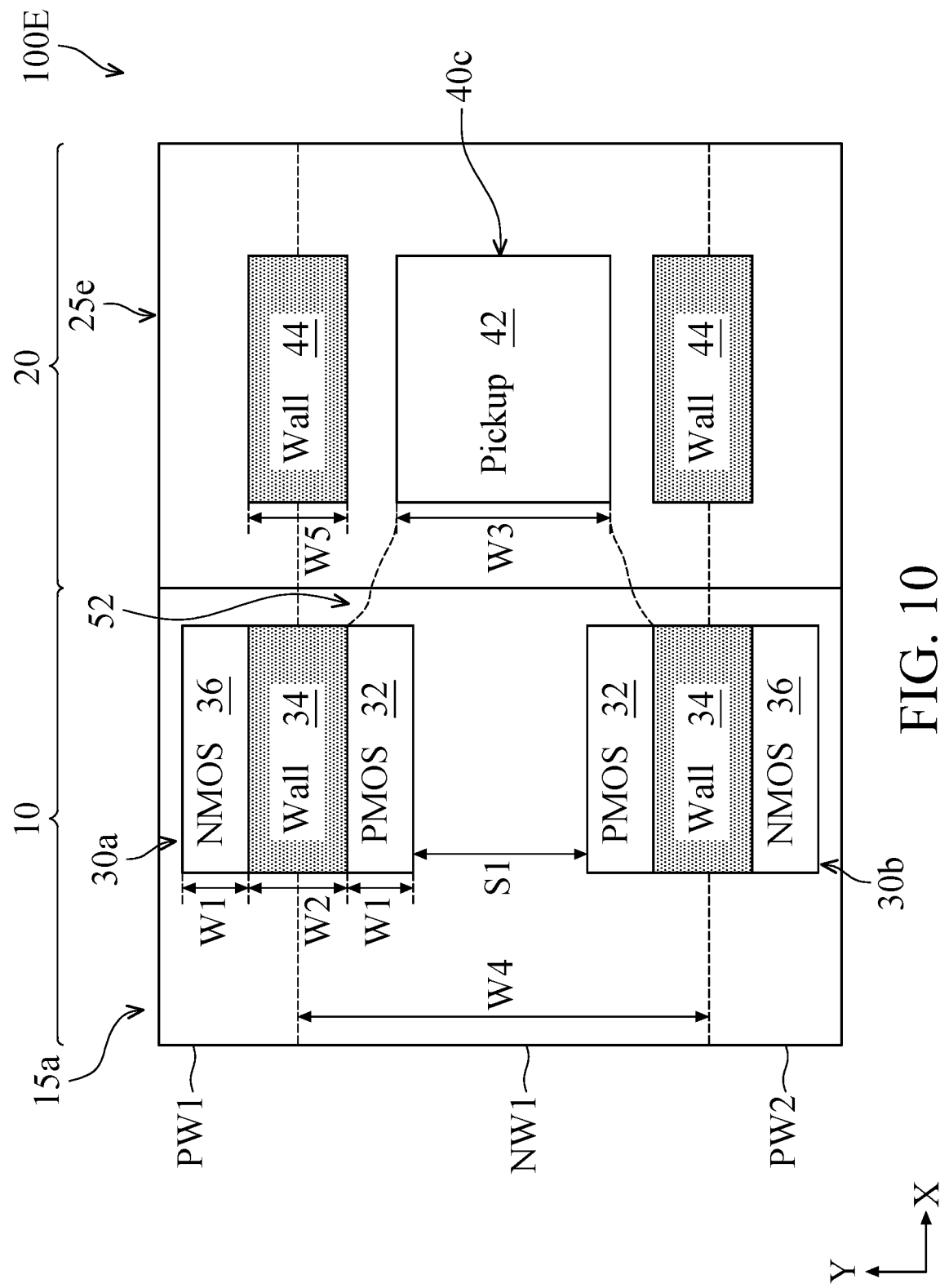
FIG. 10 shows a top view of a semiconductor device including a cell array, in accordance with some embodiments of the disclosure.

FIG. 10 shows a top view of a semiconductor device including a cell array 100E, in accordance with some embodiments of the disclosure. The cell array 100E includes multiple rows, and a portion of a row in the cell array 100E is shown in FIG. 10 to simplify the description. The cell 15a is formed in the circuit region 10, and the pickup tap cell 25e is formed in the pickup region 20. The configuration of the pickup tap cell 25e is similar to the configuration of the pickup tap cell 25d in FIG. 9, and the difference between the pickup tap cell 25e of FIG. 10 and the pickup tap cell 25d of FIG. 9 is that the pickup transistor 42 of the nanosheet structure 40c is not in contact with both of the wall structures 44. In other words, the sheet width W3 of the pickup transistor 42 in the pickup tap cell 25e of FIG. 10 is less than the sheet width W3 of the pickup transistor 42 in the pickup tap cell 25d of FIG. 9. In some embodiments, the pickup transistor 42 is separated from the wall structures 44 by the dielectric feature 230.

In FIG. 10, the sheet width W3 of the pickup transistor 42 in the pickup tap cell 25e is shorter than the distance between the wall structures 34 of the forksheet structures 30a and 30b. In such embodiments, by implementing the cell array with active region jog (labeled as 52), the pickup transistor 42 has more enclosure to the well boundary of the wall structure 34 for lower cross-well leakage.

Figure 11:
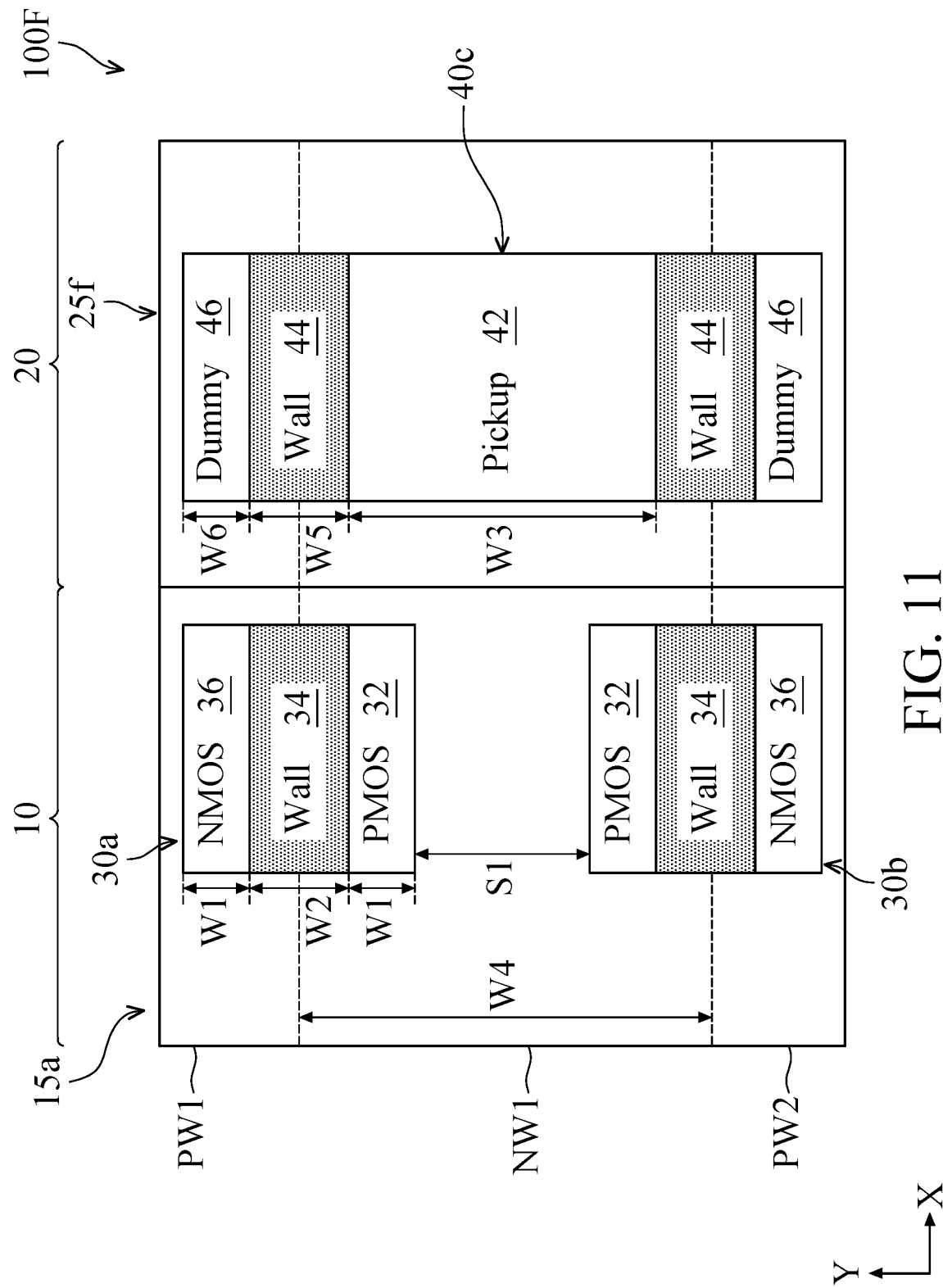
FIG. 11 shows a top view of a semiconductor device including a cell array, in accordance with some embodiments of the disclosure.

FIG. 11 shows a top view of a semiconductor device including a cell array 100F, in accordance with some embodiments of the disclosure. The cell array 100F includes multiple rows, and a portion of a row in the cell array 100F is shown in FIG. 11 to simplify the description. The cell 15a is formed in the circuit region 10, and the pickup tap cell 25f is formed in the pickup region 20. The configuration of the pickup tap cell 25f is similar to the configuration of the pickup tap cell 25d in FIG. 9, and the difference between the pickup tap cell 25f of FIG. 11 and the pickup tap cell 25d of FIG. 9 is that the pickup tap cell 25f further includes dummy transistors 46. In some embodiments, the dummy transistors 46 are nanosheet transistors.

In the pickup tap cell 25f, the dummy transistors 46 are N-type transistors. One of the dummy transistors 46 is formed over the P-type well region PW1, and is separated from the nanosheet structure 40c by the wall structure 44 extending along the interface between the P-type well region PW1 and the N-type well region NW1. Another dummy transistor 46 is formed over the P-type well region PW2, and is separated from the nanosheet structure 40c by the wall structure 44 extending along the interface between the P-type well region PW2 and the N-type well region NW1. In some embodiments, the source terminals, the drain terminals, and the gate terminals of the dummy transistors 46 are floating. In some embodiments, the gate terminals of the dummy transistors 46 are electrically connected to the VSS line, so as to turn off the dummy transistors 46.

Figure 12:
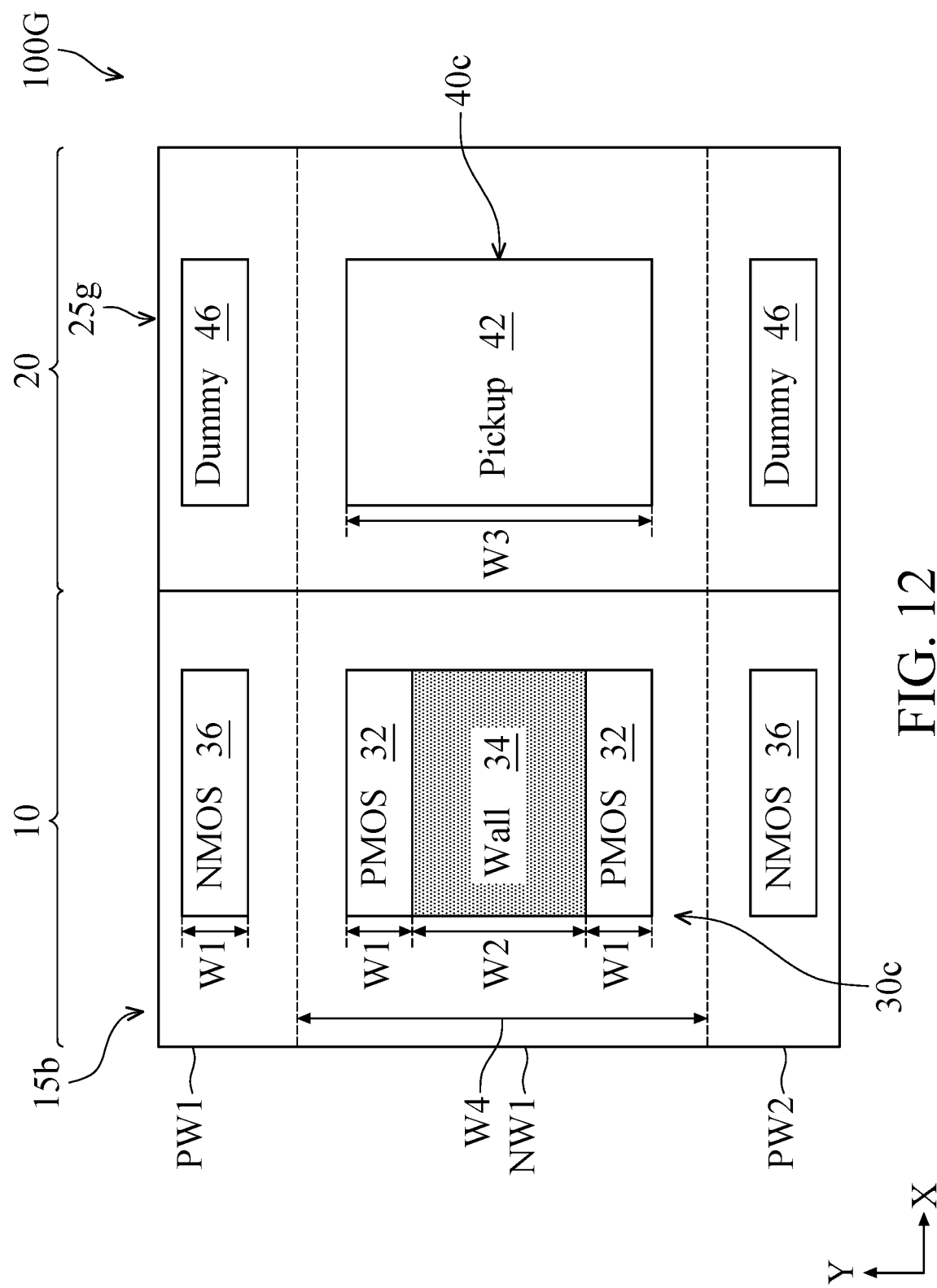
FIG. 12 shows a top view of a semiconductor device including a cell array, in accordance with some embodiments of the disclosure.

FIG. 12 shows a top view of a semiconductor device including a cell array 100G, in accordance with some embodiments of the disclosure. The cell array 100G includes multiple rows, and a portion of a row in the cell array 100G is shown in FIG. 12 to simplify the description. The cell 15b is formed in the circuit region 10, and the pickup tap cell 25g is formed in the pickup region 20. FIG. 12 is used as to demonstrate the configuration between the cell 15b and the pickup tap cell 25g. The number of the cell 15b and the pickup tap cell 25g and the row number are used as an example and are not intended to limit the cell array 100G.

The cell 15b includes the forksheet structure 30c over the N-type well region NW1. The forksheet structure 30c includes two P-type transistors 32 and a wall structure 34, and the two P-type transistors 32 are separated from each other by the wall structure 34. The wall structure 34 of the forksheet structure 30c extends in the X-direction and over the N-type well region NW1. In FIG. 12, the wall width W2 of the wall structure 34 is greater than the sheet width W1 of the P-type transistors 32 (i.e., W2>W1), and the wall width W2 of the wall structure 34 is less than the sheet width W3 of the pickup transistor 42 (i.e., W3>W2).

The cell 15b further includes an N-type transistor 36 over the P-type well region PW1 and an N-type transistor 36 over the P-type well region PW2. In such embodiments, the forksheet structure 30c is separated from the N-type transistors 36. The N-type transistors 36 are the nanosheet transistors, and no well structure is formed near the N-type transistors 36.

The pickup tap cell 25g includes the nanosheet structure 40c, and the nanosheet structure 40c includes a pickup device formed by one or more pickup transistors 42. In such embodiments, the sheet width W3 of the pickup transistor 42 is greater than the sheet width W1 of the P-type transistor 32 (i.e., W3>W1) and is less than the well width W4 of the N-type well region NW1 (i.e., W3<W4). In some embodiments, the nanosheet structure 40c is aligned with the forksheet structure 30c in the X direction.

In some embodiments, the distance between the forksheet structure 30c and the P-type well region PW1 is equal to the distance between the forksheet structure 30c and the P-type well region PW2. In some embodiments, the distance between the forksheet structure 30c and the P-type well region PW1 is different from the distance between the forksheet structure 30c and the P-type well region PW2.

In some embodiments, the distance between the nanosheet structure 40c and the P-type well region PW1 is equal to the distance between the nanosheet structure 40c and the P-type well region PW2. In some embodiments, the distance between the nanosheet structure 40c and the P-type well region PW1 is different from the distance between the nanosheet structure 40c and the P-type well region PW2.

The pickup tap cell 25g further includes the dummy transistors 46. In some embodiments, the dummy transistors 46 are the nanosheet transistors. In the pickup tap cell 25g, the dummy transistors 46 are N-type transistors. One of the dummy transistors 46 is formed over the P-type well region PW1, and is separated from the nanosheet structure 40c. Another dummy transistor 46 is formed over the P-type well region PW2, and is separated from the nanosheet structure 40c. In some embodiments, the source terminals, the drain terminals, and the gate terminals of the dummy transistors 46 are floating. In some embodiments, the gate terminals of the dummy transistors 46 are electrically connected to the VSS line, so as to turn off the dummy transistors 46.

Embodiments of semiconductor devices are provided. The semiconductor devices include cells and pickup tap cells. The cell includes the forksheet structures including two transistors with a sheet width W1 and a wall structure with a wall width W2. The pickup tap cell is formed over a well region and includes the nanosheet structure including at least one pickup transistor with a sheet width W3. The pickup tap cell is disposed adjacent to the cell along a channel direction. Furthermore, the sheet width W3 is equal to or greater than the sheet width W1, and is less than a critical dimension (CD) (e.g., a well width W4) of the well region.

In some embodiments, a semiconductor device is provided. The semiconductor device includes a first well region, a second well region, a cell and a pickup tap cell. The first well region has a first conductivity type. The second well region has a second conductivity type. The cell includes a first forksheet structure. The first forksheet structure includes a first transistor formed over the first well region, a second transistor formed over the second well region, and a first wall structure disposed on and extending along an interface between the first and second well regions. The first transistor and the second transistor are disposed on opposite sides of the first wall structure. The pickup tap cell includes a nanosheet structure. The nanosheet structure includes a pickup transistor formed over the second well region. Source/drain features of the first transistor and the pickup transistor have the second conductivity type, and source/drain features of the second transistor have the first conductivity type.

In some embodiments, a semiconductor device is provided. The semiconductor device includes a first well region, a second well region, a cell, and a nanosheet structure. The first well region has a first conductivity type. The second well region has a second conductivity type. The cell includes a first forksheet structure. The first forksheet structure includes a first transistor formed over the first well region, a second transistor formed over the second well region, and a first wall structure disposed on and extending along an interface between the first and second well regions. The first transistor and the second transistor are disposed on opposite sides of the first wall structure. The pickup tap cell includes a nanosheet structure and a second wall structure disposed on and extending along the interface between the first and second well regions. The nanosheet structure includes a pickup transistor formed over the second well region. Each of the first and second transistors includes a plurality of vertically stacked sheets with a first sheet width, and the pickup transistor includes a plurality of vertically stacked sheets with a second sheet width, wherein the second sheet width is greater than the first sheet width.

In some embodiments, a semiconductor device is provided. The semiconductor device includes a well region, a cell formed over the well region, and pickup tap cell formed over the well region. The cell includes a forksheet structure. The forksheet structure includes a first transistor, a second transistor, and a wall structure. The first transistor and the second transistor are disposed on opposite sides of the wall structure. The pickup tap cell includes a nanosheet structure. The nanosheet structure includes a pickup transistor. Source/drain features of the first and second transistors have the same conductivity type, and source/drain features of the pickup transistor and the source/drain features of the first transistor have different conductivity types.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first well region having a first conductivity type;
   a second well region having a second conductivity type;
   a cell, comprising:
      a first forksheet structure, comprising:
         a first transistor formed over the first well region;
         a second transistor formed over the second well region; and
         a first wall structure disposed on and extending along an interface between
      the first and second well regions, wherein the first transistor and the second transistor are disposed on opposite sides of the first wall structure; and
   a pickup tap cell, comprising:
      a nanosheet structure, comprising:
         a pickup transistor formed over the second well region,
      wherein source/drain features of the first transistor and the pickup transistor have the second conductivity type, and source/drain features of the second transistor have the first conductivity type.

2. The semiconductor device as claimed in claim 1, wherein each of the first and second transistors comprises a plurality of vertically stacked sheets with a first sheet width, and the pickup transistor comprises a plurality of vertically stacked sheets with a second sheet width, wherein the second sheet width is equal to or greater than the first sheet width.

3. The semiconductor device as claimed in claim 1, wherein the pickup tap cell further comprises:
a second wall structure disposed on and extending along the interface between the first and second well regions, wherein the nanosheet structure is in contact with the second wall structure.

4. The semiconductor device as claimed in claim 1, further comprising:
a third well region having the first conductivity type, wherein the second well region is disposed between the first and third well regions,
wherein a distance between the first well region and the nanosheet structure is different from or equal to a distance between the third well region and the nanosheet structure.

5. The semiconductor device as claimed in claim 1, further comprising:
a third well region having the first conductivity type, wherein the second well region is disposed between the first and third well regions,
wherein the cell further comprises:
a second forksheet structure, comprising:
a third transistor formed over the third well region;
a fourth transistor formed over the second well region; and
a second wall structure disposed on and extending along an interface between the second and third well regions, wherein the third transistor and the fourth transistor are disposed on opposite sides of the second wall structure,
wherein the pickup tap cell nanosheet structure is disposed between the first and second forksheet structures.

6. The semiconductor device as claimed in claim 5, wherein a distance between the first well region and the nanosheet structure is equal to a distance between the third well region and the nanosheet structure.

7. The semiconductor device as claimed in claim 5, wherein the pickup transistor comprises a plurality of vertically stacked sheets with a sheet width, and the sheet width is greater than a distance between the second transistor and the fourth transistor.

8. The semiconductor device as claimed in claim 5, wherein the pickup transistor comprises a plurality of vertically stacked sheets with a sheet width, and the sheet width is less than a distance between the first and second wall structures.

9. The semiconductor device as claimed in claim 1, wherein when the first well region is a P-type well region and the second well region is an N-type well region, the source/drain features of the pickup transistor are electrically coupled to a power supply voltage.

10. The semiconductor device as claimed in claim 1, wherein when the first well region is an N-type well region and the second well region is a P-type well region, the source/drain features of the pickup transistor are electrically coupled to a ground.

11. A semiconductor device, comprising:
a first well region having a first conductivity type;
a second well region having a second conductivity type;
a cell, comprising:
a first forksheet structure, comprising:
a first transistor formed over the first well region;
a second transistor formed over the second well region; and
a first wall structure disposed on and extending along an interface between the first and second well regions, wherein the first transistor and the second transistor are disposed on opposite sides of the first wall structure; and
a pickup tap cell, comprising:
a nanosheet structure, comprising:
a pickup transistor formed over the second well region; and
a second wall structure disposed on and extending along the interface between the first and second well regions,
wherein each of the first and second transistors comprises a plurality of vertically stacked sheets with a first sheet width, and the pickup transistor comprises a plurality of vertically stacked sheets with a second sheet width, wherein the second sheet width is greater than the first sheet width.

12. The semiconductor device as claimed in claim 11, wherein source/drain features of the first transistor and the pickup transistor have the second conductivity type, and source/drain features of the second transistor have the first conductivity type.

13. The semiconductor device as claimed in claim 11, further comprising:
a third well region having the first conductivity type, wherein the second well region is disposed between the first and third well regions,
wherein a distance between the first well region and the pickup tap cell is equal to a distance between the third well region and the pickup tap cell.

14. The semiconductor device as claimed in claim 11, further comprising:
a third well region having the first conductivity type, wherein the second well region is disposed between the first and third well regions,
wherein the cell further comprises:
a second forksheet structure, comprising:
a third transistor formed over the third well region;
a fourth transistor formed over the second well region; and
a third wall structure disposed on and extending along an interface between the second and third well regions, wherein the third transistor and the fourth transistor are disposed on opposite sides of the third wall structure,
wherein the nanosheet structure is disposed between the first and second forksheet structures.

15. The semiconductor device as claimed in claim 14, wherein the pickup tap cell further comprises:
a fourth wall structure disposed on and extending along the interface between the third and second well regions.

16. The semiconductor device as claimed in claim 15, wherein the pickup transistor is in contact with the second and fourth wall structures.

17. A semiconductor device, comprising:
a first well region having a first conductivity type;
a second well region having a second conductivity type;
a cell, comprising:
a first forksheet structure, comprising:
a first transistor formed over the first well region;
a second transistor formed over the second well region; and
a first wall structure disposed between the first transistor and the second transistor; and
a pickup tap cell, comprising:
a nanosheet structure, comprising:
a pickup transistor formed over the second well region;

a second wall structure disposed on and extending along an interface between the first well region and second well region; and a first dummy transistor formed over the first well region, wherein the pickup transistor and the first dummy transistor are disposed on opposite sides of the second wall structure, and wherein a source terminal and a drain terminal of the first dummy transistor are floating.

18. The semiconductor device as claimed in claim 17, further comprising:

a third well region having the first conductivity type, wherein the second well region is disposed between the first and third well regions, wherein the pickup tap cell further comprises:

a third wall structure disposed on and extending along an interface between the second well region and the third well region; and a second dummy transistor formed over the third well region, wherein the pickup transistor and the second dummy transistor are disposed on opposite sides of the third wall structure.

19. The semiconductor device as claimed in claim 18, wherein the cell further comprises:

a second forksheet structure, comprising:

a third transistor formed over the third well region;

a fourth transistor formed over the second well region; and a fourth wall structure disposed between the third transistor and the fourth transistor, wherein the first wall structure extends along the interface between the first well region and second well region, and the fourth wall structure extends along the interface between the second well region and third well region.

20. The semiconductor device as claimed in claim 17, wherein the first transistor comprises a plurality of first sheets that are vertically stacked and the second transistor comprises a plurality of second sheets that are vertically stacked, and wherein the first sheets and the second sheets are in contact with the first wall structure.

\* \* \* \* \*